United States Patent [19]

Peetz et al.

[11] 4,174,915
[45] Nov. 20, 1979

[54] MILLING CUTTER, ESPECIALLY CONTOUR MILLING CUTTER

[75] Inventors: Wolfgang Peetz, Blitzenreute; Anton Scheuch, Ravensburg; Walter Müller, Weingarten, all of Fed. Rep. of Germany

[73] Assignee: Hawera Probst GmbH & Co., Ravensburg, Fed. Rep. of Germany

[21] Appl. No.: 881,506

[22] Filed: Feb. 27, 1978

[30] Foreign Application Priority Data

Feb. 25, 1977 [DE] Fed. Rep. of Germany ... 7705745[U]

[51] Int. Cl.² ............................................. B26D 1/12
[52] U.S. Cl. ...................................... 407/59; 407/61; 407/63
[58] Field of Search .................. 407/42, 59, 115, 116, 407/60, 61, 62, 63

[56] References Cited

U.S. PATENT DOCUMENTS

| 2,070,730 | 2/1937 | Hellstrom | 407/63 |
| 2,278,738 | 4/1942 | Praeg | 407/61 |
| 2,855,657 | 10/1958 | Erhardt | 407/61 |
| 3,548,476 | 12/1970 | Cave et al. | 407/59 |
| 3,736,634 | 6/1973 | Sonnie | 407/59 |

Primary Examiner—Harrison L. Hinson
Attorney, Agent, or Firm—Becker & Becker, Inc.

[57] ABSTRACT

A milling cutter, especially contour milling cutter, which comprises individual cutting elements helically arranged around the axis of the cutter body and connected thereto. These cutting elements are separated from each other in circumferential direction of the cutter body by chip grooves. All of the chip grooves extend helically about the axis of the cutter body in the same sense. Webs project from the cutter body and extend in the same sense helically about the axis of the cutter body while being separated from each other by the above mentioned chip grooves. Along the outer web edges which are located on a common cylinder mantle there are provided depressions or cutouts separated from each other by web sections which form the individual cutting elements.

10 Claims, 3 Drawing Figures

MILLING CUTTER, ESPECIALLY CONTOUR MILLING CUTTER

The present invention relates to a milling cutter, especially a contour milling cutter, which comprises individual cutting elements spirally arranged around the axis of the cutter body and separated from one another in the circumferential direction of the cutter body by chip grooves extending helically around the axis of the cutter body.

Such contour milling cutters are mainly used for machining printed circuit boards, namely for finishing the outer edges and for milling assembly holes. The printed circuit boards consist as a rule of epoxy glass fabric, polyester glass fabric or phenolic resin paper. In particular, printed circuit boards of epoxy glass fabric and polyester glass fabric make very high demands on the contour milling cutter. The glass fabrics of the printed circuit boards subject the cutting element or cutter blades to extremely high stress with respect to their cutting power. Over and above this, the glass fabric has an enormous wearing effect on the cutter blades. The printed circuit board resins are relatively soft material and during machining operations produce more frictional heat than harder materials do. The heat development must be kept as low as possible by an appropriate blade design. However, on the other hand, the contour milling cutter should be such as to permit working at high feed rates. The blades must therefore be able to withstand high stresses.

A known contour milling cutter of the above mentioned type has small pointed cutting elements which are pyramid-shaped and are evenly distributed over the surface of the cutter body. Such milling cutters are known under the name "diamond teeth" cutters. The individual pyramid-shaped cutting elements are separated from each other by intersecting chip grooves of equal depth which extend helically around the axis of the cutter body in opposite leads. The diametral pitch of these chip grooves is between six and fourteen, depending on the required surface finish of the workpiece to be machined.

The points of the small cutting elements break easily when they are subjected to high stresses. However, in particular, they wear rapidly in the abrasive printed circuit board material. Therefore, the milling cutter cuts poorly, produces much heat, gets clogged with melting resins, and breaks. Furthermore, the intersecting chip grooves impede the chip flow during milling. Due to the rapid blade point wear, the milling cutter operating diameter is reduced and differs from the programmed value of the automatic milling machine, in which the milling cutter is usually inserted. As a result thereof, the workpiece dimensions are outside the allowable tolerances.

It is, therefore, an object of the present invention so to design a milling cutter of the kind mentioned above that the cutting elements will undergo little wear, and the chips will rapidly be removed from the area being machined.

According to the invention, this object has been realized by having all the chip grooves extend helically around the axis of the cutter body in the same sense while from the cutter body webs project which extend helically around the axis of the cutter body in the same sense and are separated from each other by the chip grooves. Furthermore, along the upper web edges, which are located on a common cylinder mantle, there are provided depressions, between which the web sections form the individual cutting elements.

The chip grooves extending helically around the axis of the cutter body in the same sens convey the chip flow, so that the milling cutter will not be clogged by chips. The chips are in the individual chip grooves removed without hindrance from the area being machined. The cutting elements located between the depression of the webs, are relatively wide, in conformity with the spacing between adjacent depressions, so that there are formed wide blades which undergo minimal wear. As a result thereof, the operating diameter of the milling cutter according to the invention is practically not reduced, so that the workpiece dimensions are always within the allowable tolerances. Due to the depressions between the cutting elements, the generation of heat by the milling cutter is reduced to a minimum. In this way, also the wear of the milling cutter according to the invention is considerably reduced over that of the known diamond-toothed milling cutters, so that the useful life of a cutter according to the invention is considerably increased. Printed circuit boards consisting of epoxy glass fabric and polyester glass fabric can be machined without difficulty with the milling cutter according to the invention. The cutting elements are highly stress resistant so that it is possible to operate at high feed rates.

The invention will now be described by way of example only, with reference to the accompanying drawings, which illustrate one embodiment thereof and in which.

Figure 1:
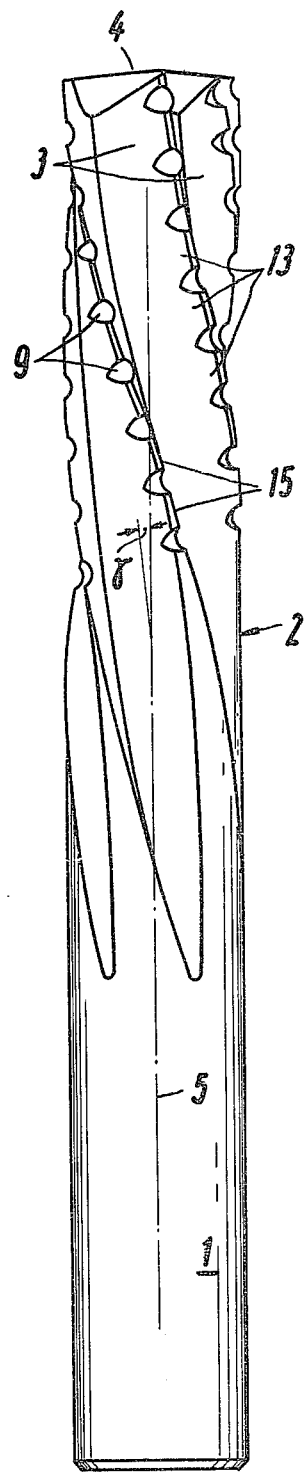
FIG. 1 shows an elevation a milling cutter according to the invention.

The milling cutter shown in the drawing is a contour milling cutter which is primarily of hard metal or carbide metal and comprises a shank 1 and a cutter body 2. The cutter body 2 is provided with webs 3 which are evenly distributed over the circumference and which extend up to the end face 4 of the milling cutter and are of equal length. That section of webs 3 which faces away from the end face 4 widens in the direction toward the shank 1. The webs 3 extend in the same sense helically around the axis 5 of the cutter body 2. Advantageously, the webs 3 are parallel to one another. Depending on the conditions of use, the webs may extend helically around the axis 5 to the right or to the left.

The webs 3 are separated from each other by chip grooves 6 which latter in a manner corresponding to webs 3 extend in the same sense helically around the axis 5 of the cutter body 2 and are of equal design. The helix angle γ ranges from approximately 15° to 20°, and is preferably 17°. As a result thereof, the chips are rapidly removed from the area being machined. Since the chip grooves 6 are parallel to one another, and thus do not intersect, a satisfactory chip flow is insured, so that the milling cutter cannot become clogged up with chips. An optimum cutting speed is 250 to 350 m/min, at which speed the chips are removed satisfactorily.

The webs 3 taper in the direction of their free ends (FIG. 2) and their outer edges 7 are over the entire length of the webs 3 located on the mantle 8 of an imaginary cylinder. As FIG. 3 shows, the webs are practically of equal height over their entire length.

Figure 3:
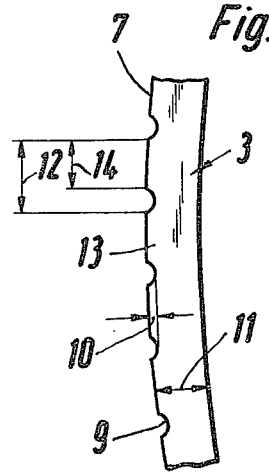
FIG. 3 shows a side view of a web of the milling cutter according to FIG. 1 in an enlarged representation.

Along the outer edge 7 of the webs 3, there are preferably, in equally spaced arrangement, provided trough-shaped depressions 9 which, when viewed transverse to the webs 3 have a circular profile (FIG. 3). As a result thereof, notch effects in the area of the depressions 9 are avoided. The depressions reduce the development of heat of the milling cutter to a minimum during machining operations of the cutter, whereby wear is reduced considerably. Since, in an advantageous manner, the depressions are provided along the webs in substantially equally spaced arrangement and are of equal design, any local unduly high heat formation will be avoided.

The height 10 of the depressions 9 is at the most half the depth 11 of the chip grooves 6. In this way, the webs are still of sufficient strength in spite of the depressions. The distance 12 between adjacent depressions 9 of the web 3 may be 1 mm or less.

The sections 13 left between the depressions 9 of each web 3 form the cutting elements of the milling cutter. The length 14 of the cutting elements 13 is approximately ⅔ of the distance 12 between adjacent depressions 9. The cutting elements are not tapered off to a point as on heretofore known milling cutters, but have a cutting edge 15 corresponding to the length of the cutting elements.

The cutting edge 15 is formed by the cutting edge of a face 16 and a peripheral land 17. The faces 16 of the cutting elements 13 extend approximately radially to the milling cutter body 2 and adjoin the associated peripheral land 17 at an acute angle. The angle $\beta$ between the peripheral land 17 and the pertaining face 16 is preferably 83°. The peripheral lands of the cutting elements 13 are located on the mantle 8 of the imaginary cylinder. Due to the peripheral land 17, the cutting elements 13 are of relatively large width within the region of the cutting edges, so that the cutting elements will without damage withstand the stress exerted when the glass fabric of printed circuit boards is severed. Furthermore, the arrangement of the peripheral land 17 acts counter to the reduction of the operating diameter of the milling cutter, so that, even when the milling cutter has been in use for some considerable time, the allowable tolerances are maintained during milling. The width 18 of the peripheral land 17, measured in the direction of rotation of the milling cutter, is very small and ranges from approximately 0.005 mm to 0.03 mm. Due to the peripheral lands, which when looking in the direction of rotation of the milling cutter, to the rear adjoin the face 16, it is insured that the cutting elements 13 will not break off during milling, so that a uniform cutting quality is guaranteed.

Figure 2:
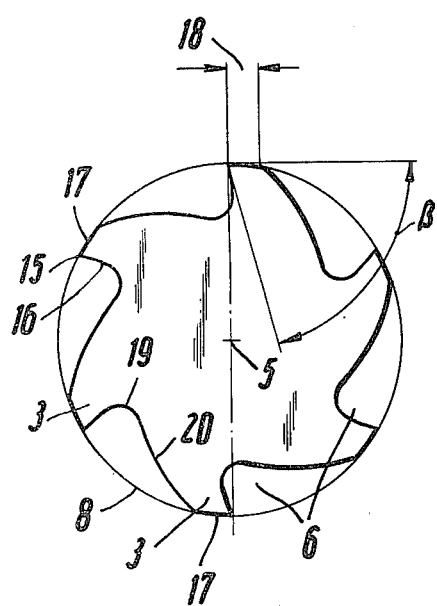
FIG. 2 shows a top view of the milling cutter according to FIG. 1 in an enlarged representation.

When looking in the direction of rotation of the milling cutter, the face 16 forms the rear confining surface of the chip groove 6 as well as one side surface of the web 3. The face 16 merges progressively with a circularly extending bottom section 19 of the chip groove 6, when looking in the direction of rotation of said milling cutter. This bottom section progressively merges toward the front with an oppositely curved guide surface 20 of the chip groove 6, which surface has a larger radius of curvature. The bottom section 19, which is concavely curved in relation to the axis 5, forms the lowest point of the chip groove 6. Measured in the circumferential direction of the cutter body 2, the lowest point of the chip groove 6 is closer to the face 16 than to the peripheral land 17 of the cutting element 13 following in the sense of rotation (FIG. 2). The guiding surface 20 adjoins at an obtuse angle the peripheral land 17 of that cutting element 13 which, when viewing in the direction of rotation of the cutter respectively forms the front cutting element. The guiding surface 20 is relatively wide so that the chips are reliably guided along the guide surface during their transportation in the direction toward the shank 1.

The depth of the chip groove 6 is less than the distance of the lowest point of the chip groove 6 from the axis 5, so that the milling cutter has a sufficiently high strength.

The depressions 9 located adjacent to each other in the circumferential direction of the cutter body 2 are staggered in the longitudinal direction of the webs 3 and are arranged so as to ascend in the opposite sense to the webs. As a result thereof, the places of the workpiece to be machined which are located in the area of the depressions 9 are machined by the cutting elements 13 of the successive webs 3 during the rotation of the milling cutter, so that an entirely flat surface is obtained on the workpiece.

Due to the blade geometry described, it is possible to double the blade life over that of the diamond teeth of the heretofore known milling cutters. The favorable chip flow in the milling cutter allows a feed increase of up to 160% over that of a diamond-toothed heretofore known milling cutter, with the cutting quality being the same. Due to this feature, the action time on the workpiece is considerably reduced, so that higher productivity rates can be realized.

The milling cutter is also capable of carrying out satisfactory roughing and finished operations at cutting speeds of less than 280 m/min.

It is, of course, to be understood that the present invention is, by no means, limited to the specific showing in the drawing, but also comprises any modifications within the scope of the appended claims.

What we claim is:

1. A milling cutter, especially contour milling cutter, which comprises a cutter body, individual cutting elements helically arranged around the axis of said cutting body and connected thereto, and webs connected to and projecting from the cutter body and extending in the same sense, helically about the axis of said cutter body while being separated from each other by chip grooves, all of said chip grooves extending helically about the axis of said cutter body in the same sense, and said webs having web edges located on a common cylinder mantle and provided with depressions along said web edges while web sections between said depressions from said individual cutting elements, each web having a peripheral land and each of said cutting elements having a face forming a relatively small angle with a radial plane of said cutter body, and adjoining one of said peripheral lands, said peripheral lands being located on said common cylinder mantle, said face and the pertaining circular land enclosing an acute angle with each other, the height of said depressions at a maximum amounting to half the depth of said chip grooves, the spacing between said depressions along said web amounting at a maximum to about 1 mm, the width of the cutting elements measured along the pertaining cutter element amounting to about ⅔ of the distance between said depressions.

2. A cutter according to claim 1, in which said acute angle is about 83°.

3. A cutter according to claim 1, in which the helical angle at which said cutting elements extend to the axis of said cutter is within the range of from 15° to 20°.

4. A cutter according to claim 3, in which said helical angle is 17°.

5. A cutter according to claim 1, in which said depressions when viewed in a direction transverse to the pertaining webs have a circular arc-shaped profile.

6. A cutter according to claim 1, in which said depressions arranged adjacent to each other in the circumferential direction of said milling cutter, are offset relative to each other in the longitudinal direction of said webs.

7. A cutter according to claim 1, in which those depressions which are adjacent to each other in the circumferential direction of said cutter body are arranged to ascend in a direction opposite to that of said webs.

8. A cutter according to claim 1, in which each of said chip grooves has a concavely curved arc-shaped bottom section which in the direction of rotation of said cutter gradually merges with an oppositely curved guiding surface of the respective chip groove, said oppositely curved guiding surface having a greater radius of curvature than said bottom section, and in which said face of each cutting element steadily merges with said bottom section.

9. A cutter according to claim 8, in which said oppositely curved guiding surfaces respectively adjoin at an obtuse angle the pertaining peripheral lands of the respective front cutting element when viewing said cutter in its direction of rotation.

10. A cutter according to claim 1, in which the width of said peripheral lands is within the range of from 0.005 mm to 0.03 mm.

* * * * *